United States Patent [19]

Tuan et al.

[11] Patent Number: 5,429,714

[45] Date of Patent: Jul. 4, 1995

[54] FABRICATION METHOD TO PRODUCE PIT-FREE POLYSILICON BUFFER LOCAL OXIDATION ISOLATION

[75] Inventors: Hsiao-Chin Tuan; Hu H. Chao, both of Hsinchu, Taiwan

[73] Assignees: ETRON Technology Inc.; Industrial Technology Research Institute, both of Hsinchu, Taiwan

[21] Appl. No.: 251,191

[22] Filed: May 31, 1994

Related U.S. Application Data

[62] Division of Ser. No. 982,708, Nov. 27, 1992, Pat. No. 5,338,750.

[51] Int. Cl.6 .............................................. H01L 21/00
[52] U.S. Cl. ..................................... 216/87; 252/79.2; 216/99
[58] Field of Search ................. 156/657, 662; 252/79.2

[56] References Cited

U.S. PATENT DOCUMENTS

| | | | |
|---|---|---|---|
| 4,062,033 | 12/1977 | Suzuki | 357/15 |
| 4,554,728 | 11/1985 | Shepard | 437/79 X |
| 4,735,916 | 4/1988 | Homma et al. | 437/152 X |
| 5,002,898 | 3/1991 | Fritzinger et al. | 437/69 |
| 5,215,930 | 6/1993 | Lee et al. | 437/228 X |
| 5,286,668 | 2/1994 | Chou | 437/60 X |
| 5,338,750 | 8/1994 | Tuan et al. | 437/69 X |

Primary Examiner—Thi Dang
Attorney, Agent, or Firm—George O. Saile; Stephen B. Ackerman

[57] ABSTRACT

A method of forming a silicon oxide isolation region on the surface of a silicon wafer consisting of a thin layer of silicon oxide on the wafer, a layer of impurity-doped polysilicon, and a layer of silicon nitride. The oxidation mask is formed by patterning the silicon nitride layer and at least a portion of the doped polysilicon layer. The silicon oxide field isolation region is formed by subjecting the structure to a thermal oxidation ambient. The oxidation mask is removed in one continuous etching step using a single etchant, such as phosphoric acid which etches the silicon nitride and polysilicon layers at substantially the same rate to complete the formation of the isolation region without pitting the monocrystalline substrate.

4 Claims, 2 Drawing Sheets

FABRICATION METHOD TO PRODUCE PIT-FREE POLYSILICON BUFFER LOCAL OXIDATION ISOLATION

This is a divisional application of Ser. No. 07/982,708, filed Nov. 27, 1992, now U.S. Pat. No. 5,338,750.

BACKGROUND OF THE INVENTION

(1) FIELD OF THE INVENTION

The invention relates to the manufacture of highly dense integrated circuits and more particularly to the formation of a silicon oxide isolation region within the integrated circuit.

(2) DESCRIPTION OF THE PRIOR ART

In the manufacture of highly dense integrated circuits, individual device structures are typically separated and electrically isolated by means of a field oxide isolation region, which is typically produced by the exposure of a silicon wafer to an oxidizing atmosphere while using an oxidation mask to protect regions which are not desired to be oxidized. Various masking layers have been used as this oxidation mask such as of a pad oxide, undoped polycrystalline silicon, silicon nitride and the like are typically deposited on top of the active region to serve as a buffer during thermal oxidation. Subsequently, this protective layer is removed by suitable etching technique.

However, in the traditional Polysilicon Buffer LOCOS (local oxidation) technique, during the etch of the polysilicon, pits can form around the edge of the pad oxide, leading to damage of the silicon substrate.

FIG. 1 shows the prior art. Shown are layer of a pad oxide 5 after the formation of the field oxide layer 7 using an undoped polysilicon layer and silicon nitride layer process. During formation of the field oxide 7, the polysilicon in the vicinity of the field oxide being formed tends to be weakened due to stress. During subsequent removal by etching of these protective layers, "pits" 8 may form in the pad oxide 5, resulting in damage to the silicon substrate as shown in FIG. 1.

Workers in the field are well aware of this pitting problem. A solution to the "pits" problem has been patented by L. B. Fritzinger et al in U.S. Pat. No. 5,002,898. The novel solution consisted of adding a protective oxide layer between the polysilicon buffer and silicon nitride layers. Removal of the silicon nitride by wet etching did not affect the polysilicon layer due to the protection afforded by the protective oxide. The protective oxide and polysilicon layers could then be removed without damage to the substrate.

SUMMARY OF THE INVENTION

It is a principal object of the invention to provide a method for forming a field oxide which by the nature of the method will prevent the formation of "pits" in the pad oxide and subsequent damage to the silicon substrate.

It is a further object of this invention to provide a method of removing the protective layers over the active regions in one continuous step, to reduce the processing required to complete formation of an integrated circuit and to overcome the pit formation problem of the prior art processes.

These objects are achieved by forming a silicon oxide isolation region on the surface of a silicon wafer consisting of a thin layer of silicon oxide on the wafer, a layer of impurity-doped polysilicon, and a layer of silicon nitride. The oxidation mask is formed by patterning the silicon nitride layer and at least a portion of the doped polysilicon layer. The silicon oxide field isolation region is formed by subjecting the structure to a thermal oxidation ambient. The oxidation mask is removed in one continuous etching step using a single etchant which etches the silicon nitride and polysilicon layers at substantially the same rate to complete the formation of the isolation region.

DESCRIPTION OF THE PREFERRED EMBODIMENTS

Figure 1:
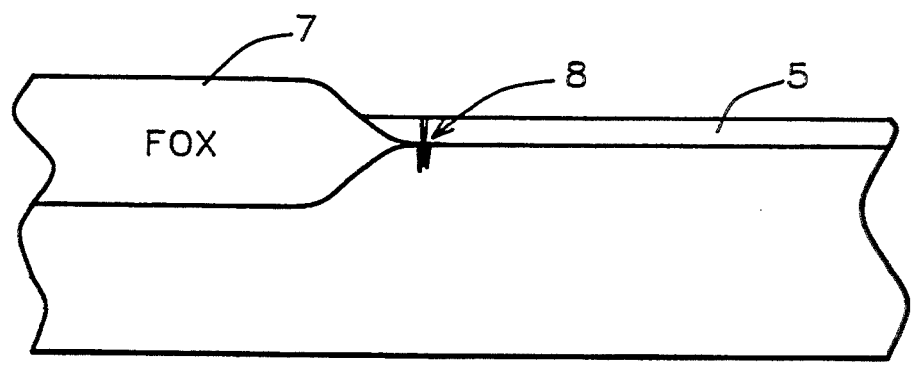
FIG. 1 is a schematic cross-sectional representation of the result of a Prior Art process for forming the field oxide region of an integrated circuit which contains the pitting problem.
Figure 2:
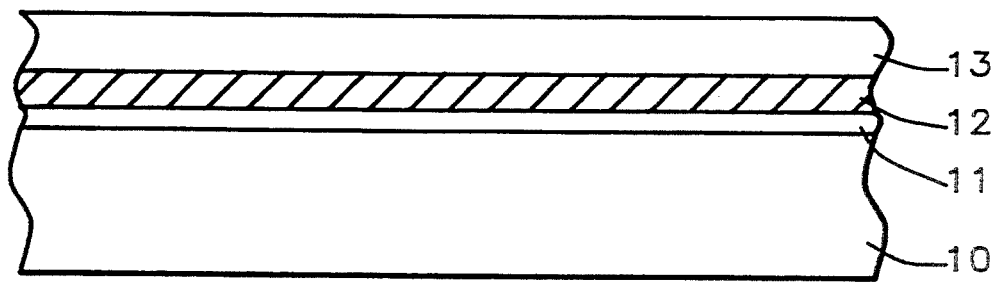
FIGS. 2 to 5 are a schematic cross-sectional representation of a new method for forming the field oxide region and for removal of the protective oxidation mask layer.

Referring now more particularly to FIG. 2, there is shown an embodiment method for making the field oxide of the present invention. The first series of steps involves the formation of the pad oxide layer 11 on the silicon substrate 10. The surface of the bare silicon substrate 10 is thermally oxidized to form the desired pad oxide layer 11, by exposure to dry or wet oxygen at a temperature of about 800° to 900° C. for time sufficient to form the preferred thickness of between about 50 and 300 Angstroms. This layer may alternatively be deposited by chemical vapor deposition methods.

The polysilicon layer 12 is blanket deposited by LPCVD (Low Pressure Chemical Vapor Deposition) method. This method to produce the critically doped polysilicon layer 12 can be accomplished by either forming the doped layer in situ at a temperature in the range of about 620° to 700° C. or forming undoped polysilicon and then doping the layer as by thermal diffusion or ion implantation. The critical element of the processes is to assure a uniform, high dosage doping of the polysilicon with a dopant such as phosphorus or arsenic of greater than about 1 E 19 atoms/cm$^3$. The preferred thickness of the polysilicon layer 12 is between about 1200 and 4000 Angstroms. The undoped polysilicon layer 12 is ion implanted with phosphorous, arsenic or boron ions under the conditions 5×10 E 14 to 5×10 E 16 atoms/cm$^2$ dosage with energy of between about 30 and 80 Kev. followed by an anneal at more than about 850° C. for more than about 25 minutes in an inert atmosphere, or thermally doped with phosphorus oxychloride at a temperature greater than about 850° C.

The silicon nitride layer 13 is blanket deposited by LPCVD using standard silicon and nitrogen sources and conditions to produce a thickness in the preferred range of 1500 to 3500 Angstroms.

Figure 3:
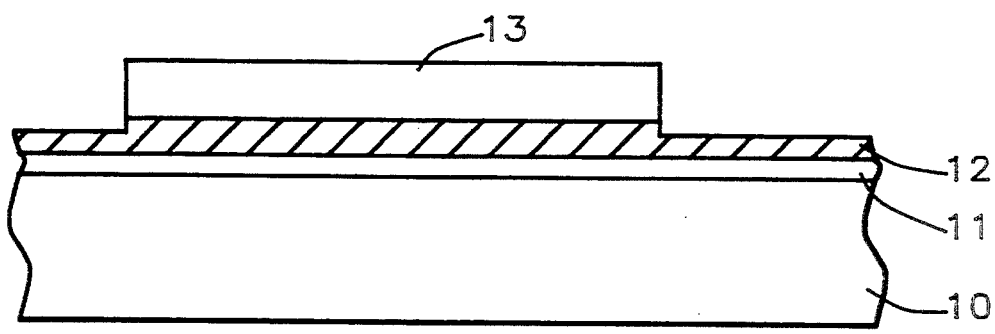

FIG. 3 shows the silicon nitride layer 13, after being patterned using a resist masking layer and suitable etching to define a region to be protected by the oxidation mask during field oxide formation. The lithography and etching are conventional. The preferred etching process is anisotropic etching in a suitable plasma including chlorofluorocarbon materials as is known in the art. It is shown in FIG. 3 that the etching step of the silicon nitride layer 13 also etches a portion of doped polysilicon layer 12 which is acceptable and may be preferred.

Figure 4:
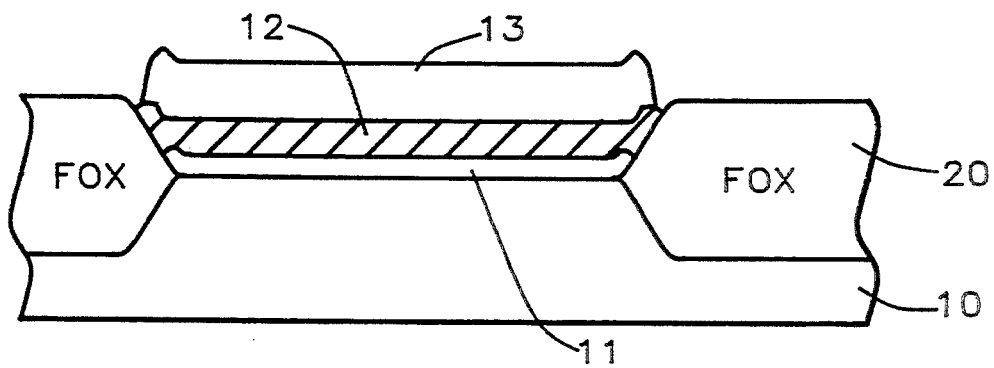

FIG. 4 shows the resultant exposed unmasked surface which is now thermally oxidized to grow the field silicon oxide 20, at a temperature of more than about 900° C. in a steam ambient for time sufficient to form the conventionally desired field silicon oxide layer 20.

Figure 5:
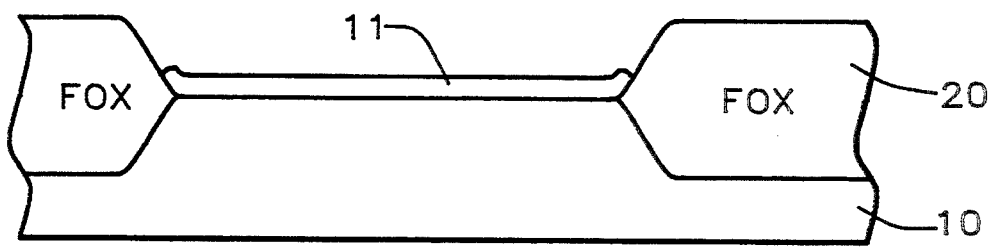

FIG. 5 shows the structure of FIG. 4 after the key and critical step of stripping layers 12 and 13 from the active region, leaving the pad silicon oxide layer 11. In the preferred embodiment, layers 12 and 13 are simultaneously etched using phosphoric acid ($H_3PO_4$) at an operative temperature range of between about 150° to 180° and preferably about 155° to 165° C. The operative concentration of the phosphoric acid in water is $98 \pm 0.5\%$ $H_3PO_4$ and $2 \pm 0.5\%$ $H_2O$. The etching process will end at the silicon oxide layer 11 interface, because phosphorus acid solution does not attack silicon oxide.

The following are examples which are intended to merely help in the understanding of the invention and not to limit the invention.

EXAMPLE I

A layer of undoped polysilicon was deposited by the CVD process as described above to a thickness of 3500 Angstroms at 620° C., on a silicon oxide layer covering a silicon wafer, The layer was doped using $POCl_3$ at a temperature of 950° C. for a time of 8 minutes in a diffusion furnace. The sample was cooled to room temperature. The wafer sample was then immersed into $H_3PO_4$ bath at a temperature of 160° C. for 90 minutes. The etching results recorded in TABLE I are average results from samples taken at 5 different locations on the wafer.

EXAMPLE II

A layer of polysilicon was (in-situ) doped with phosphorus during deposition, and deposited to a thickness of 1500 Angstroms at 675° C. on a silicon oxide layer covering a silicon wafer. The sample was cooled to room temperature. The wafer sample was then immersed into $H_3PO_4$, bath at a temperature of 160° C. for 100 minutes. The etching results recorded in TABLE I are average results from samples taken at 5 different locations on the wafer.

EXAMPLE III

A layer of undoped polysilicon was deposited to a thickness of 3500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

EXAMPLE IV

A layer of undoped polysilicon was deposited to a thickness of 4500 Angstroms at 620° C. on a silicon oxide layer covering a silicon wafer. The sample was cooled to room temperature. The wafer sample was then immersed into $H_3PO_4$ bath at a temperature of 160° C. for 100 minutes. The etching results recorded in TABLE I are average results from samples taken at 5 different locations on the wafer.

TABLE I

| EXAMPLE | | thickness (Angstroms) | etching rate (Angstroms/hr) |
|---|---|---|---|
| I | before etch | 3258 | |
| | after etch | 2100 | |
| | etching loss | 1158 | |
| | Etching rate | | 772 |
| II | before etch | 1574 | |
| | after etch | 524 | |
| | etching loss | 1050 | |
| | Etching rate | | 630 |
| III | before etch | 4547 | |
| | after etch | 4529 | |
| | etching loss | 18 | |
| | Etching rate | | 11 |
| IV | before etch | 3658 | |
| | after etch | 3406 | |
| | etching loss | 252 | |
| | Etching rate | | 151 |

The results of the Examples I–IV show that phosphoric acid very effectively etches phosphorus oxychloride doped polysilicon and phosphorus in situ doped polysilicon. However, undoped polysilicon does not satisfactorily etch with phosphoric acid. Silicon nitride is known in the art as satisfactorily etchable with phosphoric acid. Our conclusion is that phosphoric acid at about 160° C. can etch heavily phosphorus doped polysilicon. The etching rate is between about 600 to 800 Angstroms per hour.

EXAMPLES V–XII

Similar experiments have been performed for uniform and high dose doping with arsenic and boron using ion implantation sources of, respectively arsenic and boron difluoride. The results with doping levels of greater than about 1 E 19 atoms/$cm^3$. using phosphorus acid solution at 160° C. produced similar etching rates as with the phosphorus doping polysilicon Examples given above. The conditions and results of these Examples V–XII are shown in TABLE:Phosphoric Acid Etching Rate of Implanted Polysilicon as seen below.

Our experiments have shown that the use of phosphoric acid at elevated temperatures to remove both the silicon nitride and uniformly, heavily doped polysilicon layer with one etching step produces a pitting free monocrystalline silicon surface adjacent to the field silicon oxide regions 20.

TABLE

Phosphoric Acid Etching Rate of Implanted polysilicon

| Example | | thickness (Anstrong) | etching rate (Anstrong/hr) | Process Condition |
|---|---|---|---|---|
| V | before etch | 1925 | | As Imp, 80KeV, 5E15/cm 3 |
| | after etching | 1311 | | 900° C. Annealing, 30 min |
| | etching loss in 75 min | 614 | 491 | |
| VI | before etch | 1925 | | As Imp, 80KeV, 5E15/cm 3 |
| | after etching | 280 | | No Annealing |
| | etching loss in 75 min | 1645 | 1316 | |
| VII | before etch | 1925 | | As Imp, 80KeV, 1E16/cm 3 |
| | after etching | 1098 | | 900° C. Annealing, 30 min |
| | etching loss in 75 min | 827 | 662 | |

TABLE-continued

| Phosphoric Acid Etching Rate of Implanted polysilicon | | | |
|---|---|---|---|
| Example | thickness (Anstrong) | etching rate (Anstrong/hr) | Process Condition |
| VIII | before etch 1925 | | As Imp, 80KeV, 1E16/cm 3 |
| | after etching 274 | | No Annealing |
| | etching loss in 75 min 1651 | 1321 | |
| IX | before etch 1925 | | BF2 Imp, 60KeV, 5E15/cm 3 |
| | after etching 1507 | | 900° C. Annealing, 30 min |
| | etching loss in 75 min 418 | 334 | |
| X | before etch 1925 | | BF2 Imp, 60KeV, 5E15/cm 3 |
| | after etching 733 | | No Annealing |
| | etching loss in 75 min 1192 | 954 | |
| XI | before etch 1925 | | BF2 Imp, 60KeV, 1E16/cm 3 |
| | after etching 1550 | | 900° C. Annealing, 30 min |
| | etching loss in 75 min 375 | 300 | |
| XII | before etch 1925 | | BF2 Imp, 60KeV, 1E16/cm 3 |
| | after etching 916 | | No Annealing |
| | etching loss in 75 min 1009 | 807 | |

While the invention has been particularly shown and described with reference to the preferred embodiments thereof, it will be understood by those skilled in the art that various changes in form and details may be made without departing from the spirit and scope of the invention.

What is claimed is:

1. A method of simultaneously etching silicon nitride and doped polysilicon comprising:

providing a body of said silicon nitride and a body of undoped polysilicon;

ion implanting an impurity into said layer of undoped poylsilicon in a concentration greater than about 5 E 15 atoms/cm$^3$ to form a body of doped polysilicon, and not annealing the doped polysilicon;

simultaneously etching said silicon nitride body and said doped polysilicon body, using phosphoric acid ($H_3PO_4$) at a temperature of between about 150° to 180° C. to remove desired portions of each of said bodies, wherein the etching rate of said silicon nitride body and said doped polysilicon body are closer because of said not annealing the doped polysilicon.

2. The method of claim 1 wherein said impurity is phosphorus.

3. The method of claim 1 wherein said impurity is arsenic.

4. The method of claim 1 wherein said impurity is boron.

* * * * *